(12) United States Patent
Kim et al.

(10) Patent No.: US 7,528,481 B2
(45) Date of Patent: May 5, 2009

(54) WAFER LEVEL PACKAGING CAP AND FABRICATION METHOD THEREOF

(75) Inventors: Yong-sung Kim, Seoul (KR);
Woon-Bae Kim, Suwon-si (KR);
Kyu-dong Jung, Suwon-si (KR);
Chang-seung Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 205 days.

(21) Appl. No.: 11/491,086

(22) Filed: Jul. 24, 2006

(65) Prior Publication Data

US 2007/0164410 A1    Jul. 19, 2007

(30) Foreign Application Priority Data

Jan. 16, 2006    (KR) ............... 10-2006-0004560

(51) Int. Cl.
*H01L 23/12* (2006.01)
*H01L 23/10* (2006.01)

(52) U.S. Cl. .................. 257/704; 257/710; 257/787

(58) Field of Classification Search ............... 257/704, 257/710, 787, E23.181, E23.188
See application file for complete search history.

(56) References Cited

U.S. PATENT DOCUMENTS

| 6,630,725 B1 | 10/2003 | Kuo et al. |
| 6,777,263 B1 | 8/2004 | Gan et al. |
| 2005/0054133 A1 * | 3/2005 | Felton et al. ............... 438/50 |

FOREIGN PATENT DOCUMENTS

| EP | 0609062 A1 | 8/1994 |
| EP | 1041625 A1 | 10/2000 |
| EP | 1071126 A2 | 1/2001 |
| EP | 1688994 A1 | 8/2006 |
| KR | 1020050010647 | * 6/2006 |

* cited by examiner

*Primary Examiner*—Hung Vu
(74) *Attorney, Agent, or Firm*—Sughrue Mion, PLLC

(57) ABSTRACT

A fabrication method of a wafer level packaging cap for covering a device wafer provided with a device thereon, includes forming an insulating layer on a wafer; removing a predetermined part of the insulating layer and exposing an upper surface of the wafer; forming a cap pad extending from an upper surface and the exposed surface of the wafer; forming a cavity on a lower surface of the wafer corresponding to the cap pad; etching a bottom surface of the cavity and exposing the cap pad which is connected to the wafer through the cavity; and forming metal lines extending from the lower surface of the wafer and the cavity, to electrically connect the cap pad which is exposed through the cavity.

6 Claims, 9 Drawing Sheets though an ashing process, a mask used to form the pattern (not shown) of the connection hole 10a is removed. As illustrated in FIG. 1C, a metal is deposited in the connection hole 10a by plating it with metal material from the seed layer 11 on the bottom of the connection hole 10a, in order to form a plurality of connection units 12. The connection units 12 go through lapping and chemical mechanical planarization (CMP) processes to make their different heights uniform and then they are cleaned.

The metal is deposited on the upper surface of the wafer 10, and patterned through a photolithography process. As illustrated in FIG. 1D, a cap pad 13 is formed to electrically connect to the connection unit 12.

The seed layer 11 on the lower surface of the wafer 10 is formed with a first metal line (11' of FIG. 1D) by use of the photolithography process. The lower surface of the wafer 10 is formed with a second metal line 14 connected to the first metal line 11', and a sealing line 15. The sealing line 15 is used to package the device substrate during the packaging process.

As illustrated in FIG. 1E, the completed packaging cap 1 covers an upper part of a device wafer 2.

However, the packaging cap manufactured through the above-described process has the following problems. The wafer needs to be thick to prevent any possible loss or damage to the wafer during processing, accordingly increasing the package size.

The connection holes of the wafer need to penetrate the wafer, inconveniently requiring a long processing time. That is, common silicon (Si) wafer which is used as the cap substrate has a difficulty in lowering the thickness of the cap substrate to 300 μm or less, due to the inconvenience in processing of the Si. Accordingly, it is hard to save unit costs.

The connection hole which penetrates the wafer requires a longer time for plating metal materials in deep connection holes and thus increases the entire costs.

The connection holes formed on the cap substrate are directly plated with the metal materials, so the metal materials fail to be firmly attached to the holes, dropping electric stability.

WAFER LEVEL PACKAGING CAP AND FABRICATION METHOD THEREOF

CROSS-REFERENCE TO RELATED APPLICATIONS

This application claims priority under 35 U.S.C. § 119(a) of Korean Patent Application No. 10-2006-0004560, filed Jan. 16, 2006, in the Korean Intellectual Property Office, the entire contents of which are incorporated herein by reference.

BACKGROUND OF THE INVENTION

1. Field of the Invention

The present invention relates to a wafer level packaging method. More particularly, the present invention relates to a wafer level packaging cap used for the packaging method, and a fabrication method thereof.

2. Description of the Related Art

Generally, minute structures manufactured in a chip unit such as an RF filter, a communication-use RF switch and an RF MEMS, and particular function-performing devices such as an actuator, are vulnerable to water, other particles and high temperature, accordingly requiring packaging.

The packaging is performed by covering and sealing up an upper surface of a device wafer formed with the particular function-performing device, with a cap formed having a predetermined cavity offering a space to house the device.

A wafer level packaging is to seal up a wafer having a plurality of devices, with a packaging cap formed in a wafer unit, before cutting the wafer in a chip unit.

The device wafer includes a device substrate, a particular function-performing device formed on an upper surface of the device substrate and a plurality of device pads electrically connected to the device. The device wafer is manufactured through a general semiconductor manufacturing process.

The packaging cap includes: a cap substrate having a predetermined of cavity housing the device on a lower surface thereof, and joined with the device wafer; a plurality of first metal lines formed on the lower surface of the cap substrate, corresponding to a plurality of device pads electrically connected to the device; a plurality of second metal lines corresponding to the first metal lines and formed inward of the cavity from the lower surface of the cap surface; a plurality of connection holes penetrating upwardly in the cap substrate, corresponding to the second metal lines respectively; a plurality of connection units formed inside the connection holes and electrically connected to the second metal lines; and a plurality of cap pads formed on the upper surface of the cap substrate and electrically connected to a plurality of upper parts of the connection units.

The packaging is completed by bonding the device wafer and the packaging cap by use of sealing lines formed thereon.

Referring to FIGS. 1A through 1E, the packaging cap fabrication method will be described hereinafter.

As illustrated in FIG. 1A, a wafer 10 is provided to act as the cap substrate of the packaging cap. A cavity is created on a lower surface of the wafer 10 through a predetermined process. A seed metal is deposited to cover a surface of the cavity and the lower surface of the wafer 10, in order to form a seed layer 11.

As illustrated in FIG. 1B, an upper surface of the wafer 10; that is, a reverse surface to a seed layer-formed surface, is mask-patterned and dry-etched by use of induced coupled plasma ion etching device (ICP-RIE) until completely penetrating the wafer 10, to process a connection hole 10a.

SUMMARY OF THE INVENTION

An aspect of the present invention is to address the above problems and/or disadvantages of the related art and to provide at least the advantages described below. Accordingly, an aspect of the present invention is to provide a wafer level packaging cap and a fabrication method thereof, which has a simple structure and an easy manufacturing method.

In order to achieve the above-described aspects of the present invention, there is provided a wafer level packaging cap for covering a device wafer provided with a device thereon, the wafer level packaging cap, comprising: a cap substrate formed with a predetermined cavity for housing the device on a lower surface, the cap having a first passing hole penetrating therethrough and adapted to be joined with the device wafer; an insulating layer formed on an upper surface of the cap substrate and having a second passing hole corresponding to the first passing hole; a cap pad formed on an upper surface of the insulating layer; and metal lines formed on a lower surface of the cap substrate adapted to correspond to a plurality of device pads which are electrically connected to the device. The metal lines and the cap pad are electrically connected to each other at the first and second passing holes.

The metal lines extend from the lower surface of the cap substrate, a bottom surface of the cavity, and an inclined surface which connects the lower surface of the cap substrate and the bottom surface of the cavity.

The cap pad and the metal lines are formed by patterning metals by use of a spray coating process.

The first passing hole may be 10 to 20 μm deep.

The cap pad and the metal lines are formed at a boundary between the first and second passing holes.

The wafer level packaging cap further wherein the cap substrate comprises cap sealing lines corresponding to sealing lines of the device wafer.

In order to achieve the above-described aspects of the present invention, there is provided a fabrication method of a wafer level packaging cap for covering a device wafer provided with a device thereon, the fabrication method of the wafer level packaging cap comprising: a) forming an insulating layer on a wafer; b) removing a predetermined part of the insulating layer and exposing an upper surface of the wafer; c) forming a cap pad extending from an upper surface and the exposed surface of the wafer; d) forming a cavity on a lower surface of the wafer corresponding to the cap pad; e) etching a bottom surface of the cavity and exposing the cap pad which connects to the wafer through the cavity; and f) forming metal lines extending from the lower surface of the wafer and the cavity, to electrically connect the cap pad which is exposed through the cavity to the metal lines.

The operation b) comprises: patterning a mask on the insulating layer; etching the insulating layer exposed by the mask pattern at a predetermined depth from the upper surface thereof and processing a passing hole for exposing the wafer; and removing the mask pattern.

The operation c) comprises: patterning the mask on the insulating layer; applying metals on the insulating layer exposed by the mask pattern and the exposed surface of the wafer; and removing the mask pattern.

The operation of removing the mask pattern removes the mask pattern by use of a lift-off process.

The operation d) processes the lower surface of the wafer by use of a wet etching process.

The lower surface of the wafer is processed such that there is a thickness of 10 to 20 μm between the bottom surface of the cavity and the upper surface of the wafer at the time of processing the cavity.

The operation e) uses a dry etching process.

The operation f) comprises: patterning a predetermined thickness of insulating layer on the lower surface of the wafer, so that the cap pad is exposed through the cavity and the predetermined part of the lower surface of the wafer is exposed; and electrically connecting to the cap pad exposed through the cavity to the metal lines, and patterning the metal lines to cover the insulating layer.

The insulating layer is patterned by use of a spray coating process.

The insulating layer is formed of polymer materials.

The operation f2) comprises: forming a resist to cover the wafer exposed by passing the insulating layer; applying the metals to cover the insulating layer, the resist and the cap pad exposed through the cavity; and removing the resist.

Sealing lines are formed which are electrically insulated from the metal lines by removing the resist, and bonded with the device wafer.

The operation of removing the resist uses a lift-off process.

The operation f2) comprises: patterning a first resist on a lower surface of the wafer to cover a predetermined part of the lower surface of the wafer, and the cap pad being exposed through the cavity; forming the insulating layer to cover the first resist and the lower surface of the wafer; exposing the first resist and partially exposing the cap pad and the lower surface of the wafer; patterning a second resist to cover the lower surface of the exposed wafer; applying the metals to cover the second resist, the insulating layer and the cap pad exposed through the cavity; and removing the second resist and forming the metal lines.

Sealing lines are simultaneously formed which are electrically isolated from the metal lines at the time of removing the second resist, and bonded to the device wafer.

The insulating layer is formed by depositing insulating materials.

The insulating materials include one of $SiO_2$, SiN, and $TiO_2$.

The first resist is formed by use of a lift-off process.

The second resist is formed by use of a lift-off process.

BRIEF DESCRIPTION OF THE DRAWINGS FIGURES

The above aspect and other features of the present invention will become more apparent by describing in detail exemplary embodiments thereof with reference to the attached drawing figures, wherein.

DETAILED DESCRIPTION OF THE EXEMPLARY EMBODIMENTS

Figure 1A:
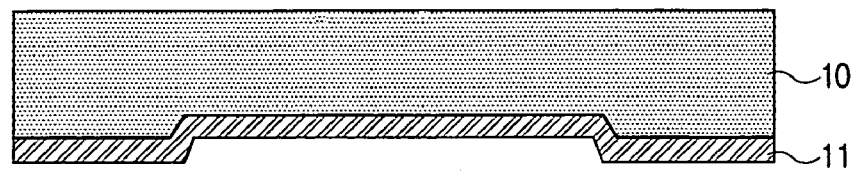
FIGS. 1A through 1E are process-views showing a fabrication method of a wafer packaging cap according to a prior art method.
Figure 1B:
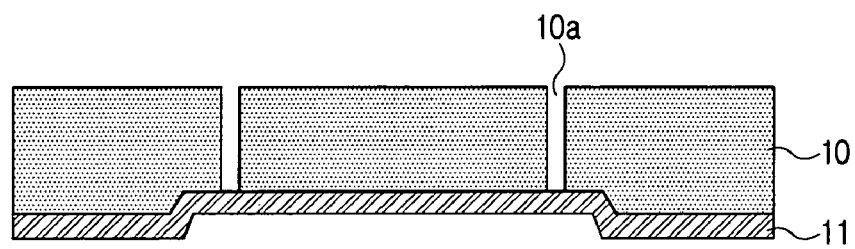
Figure 1C:
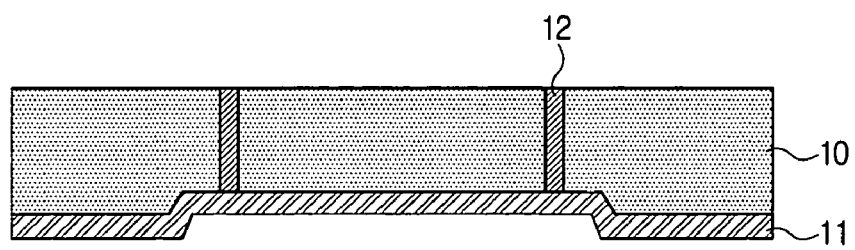
Figure 1D:
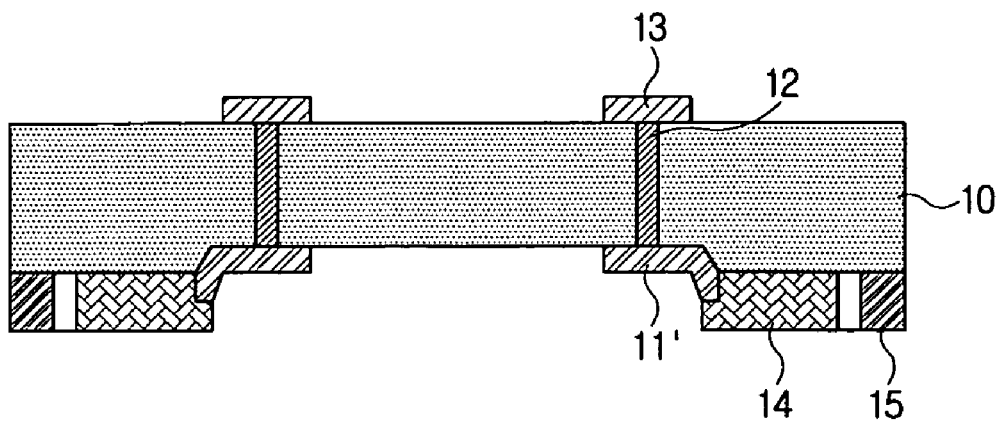
Figure 1E:
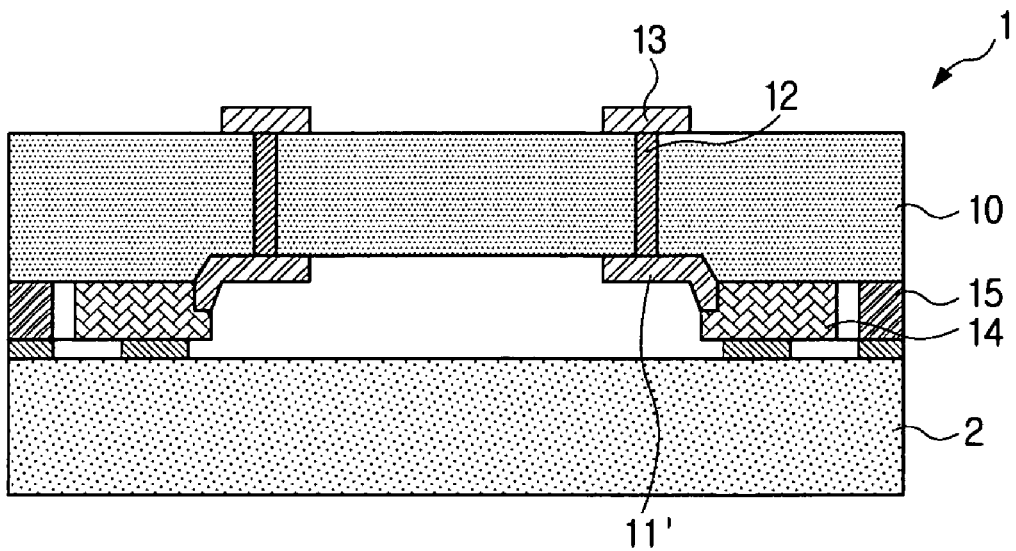

Hereinafter, exemplary embodiments of the present invention will be described in detail with reference to the accompanying drawing figures.

In the following description, the same drawing reference numerals are used for the same elements even in different drawings. The matters defined in the description such as a detailed construction and elements are provided simply to assist in a comprehensive understanding of the invention. Thus, it is apparent that the present invention can be carried out without those defined matters. Also, well-known functions or constructions are not described in detail since they are not necessary for understanding the invention.

Figure 2A:
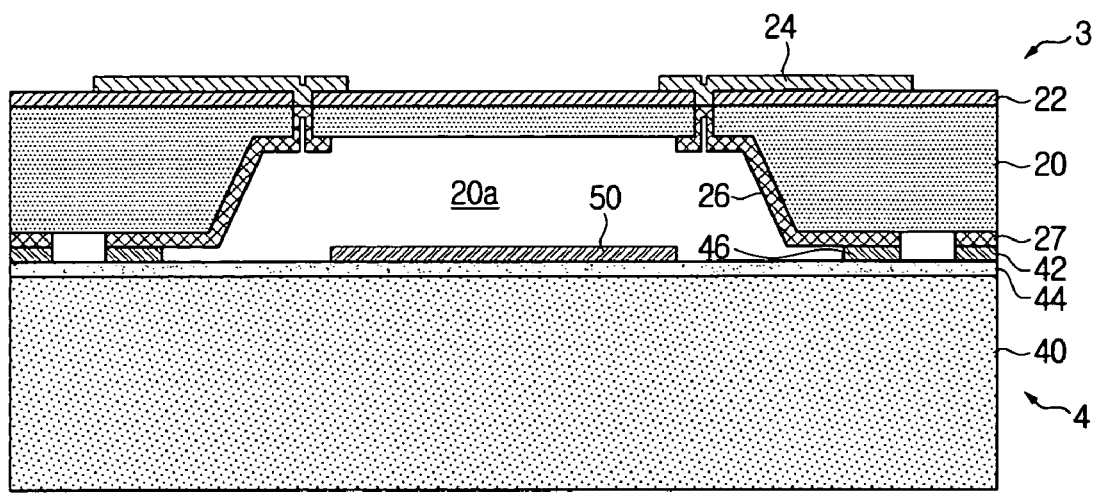
FIG. 2A shows a chip packaged by a wafer level packaging cap according to an exemplary embodiment of the present invention.
Figure 2B:
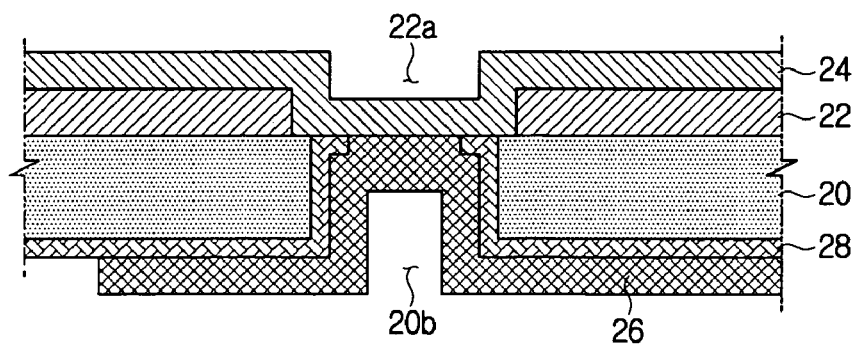
FIG. 2B is a partial view of a main part of FIG. 2A.

Referring to FIGS. 2A and 2B, a wafer level packaging cap 3 according to an exemplary embodiment of the present invention is used to cover an upper part of a device wafer 4 having a device 50 on an upper surface thereof. The packaging cap 3 includes a cap substrate 20 having a cavity 20a on a lower part thereof, an insulating layer 22 provided on an upper part of the cap substrate 20, a cap pad 24 provided on the insulating layer 22, and a metal line 26 provided on the lower part of the cap substrate 20.

The cap substrate 20 is an Si wafer (hereinafter, referred to as the "wafer").

The cavity 20a is a space to house the device 50, etched at a predetermined depth from the lower surface of the wafer 20. The cavity 20a includes a flat bottom surface and an inclined surface.

The wafer 20 has a first passing hole 20b penetrating through the cavity 20a. The first passing hole 20b penetrates the upper surface of the cap substrate 20 from a bottom surface of the cavity 20a. The cap pad 24 and the metal line 26 are electrically connected through the first passing hole 20b, which will be described in more detail later. The bottom of the cavity 20a is distanced 10 to 20 μm from the upper surface of the cap substrate 20. Accordingly, the first passing hole 20b is 10 to 20 μm in depth.

The insulating layer 22 is formed at a predetermined thickness to cover the upper surface of the wafer 20. The insulating layer 22 has a removed part corresponding to the cavity 20a, to form a second passing hole 22a exposing the upper surface of the wafer 20. The cap pad 24 is partially provided on an upper surface of the insulating layer 22, covering the exposed part of the wafer 20 through the second passing hole 22a. The cap pad 24 is spray-coated with metal materials such as copper and patterned by use of a lift-off process. A plurality of cap pads 24 are provided according to the number of device pads 46, and electrically connect the device 50 covered with the packaging cap 3, and an external device.

The metal line 26 is provided on the lower surface of the wafer 20, and extends to the inclined surface and bottom surface of the cavity 20a in a predetermined pattern. The metal line 26 is directly connected to the cap pad 24 exposed through the first passing hole 20b. The metal line 26 is formed by spray-coating the metal materials on the lower surface of the wafer 20 and patterning by use of the lift-off process.

An insulating layer 28 is formed at a predetermined thickness on the lower surface of the wafer 20. The insulating layer 28 is for insulating the metal line 26 and the wafer 20, and may be patterned by use of the spray coating process. In this case, a polymer including B-staged bisbenzocyclobutene (BCB) may be used as insulating materials.

The insulating layer 28 may be formed by use of a deposition process when it is low-temperature. In this case, $SiO_2$, SiN and $TiO_2$ may be used as the insulating materials.

A sealing line 27 is formed on an edge of the lower surface of the wafer 20. The sealing line 27 is insulated from the wafer 20 by the insulating layer 28. The sealing line 27 may be formed by patterning together with the metal line 26, when it is formed. The sealing line 27 is used for joining with a sealing line 42 formed on a packaged surface of a wafer body of the device wafer 4.

In FIG. 2A, a reference numeral 44 indicates an insulating layer formed on a packaged surface of the wafer body 40. The device 50, the device pad 46 and the sealing line 42 are formed on the insulating layer 44.

A chip is packaged by bonding the packaging cap 3 and the device wafer 4, which is formed with the device 50 for performing a particular function on the upper surface thereof, by use of solder; that is, the sealing lines 27 and 42.

With the abovementioned, according to the embodiment of the present invention, it is possible to form and connect the cap pad 24 and the metal line 26 by use of the spray coating process rather than plating. Accordingly, the electric connection is enhanced and a complex process such as plating may be avoided, so that the manufacturing process is simplified.

Hereinafter, a fabrication method of a wafer level packaging cap will be described.

Figure 3A:
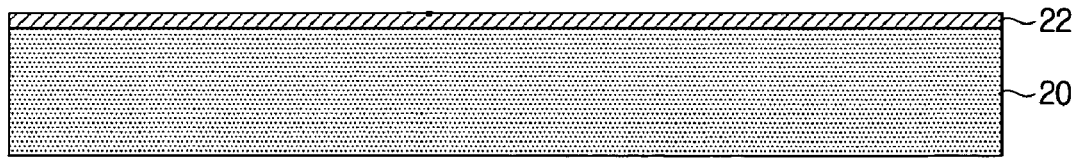
FIGS. 3A through 3G are process-views showing a fabrication method of a wafer packaging cap according to the embodiment of the present invention.

As illustrated in FIG. 3A, an insulating layer 22 is deposited on an upper part of a wafer 20 at a predetermined thickness which will act as a cap substrate later.

Figure 3B:
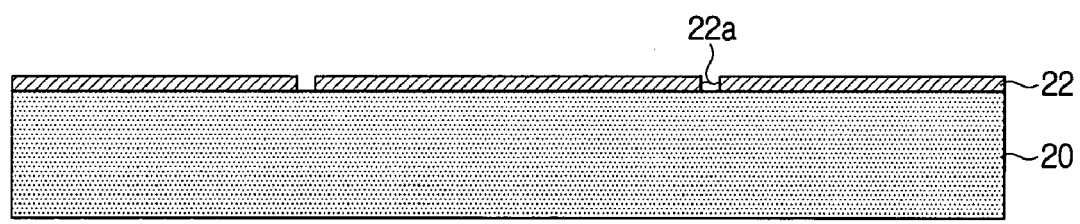

As illustrated in FIG. 3B, a predetermined part of the insulating layer 22 is removed by patterning. That is, the insulating layer 22 is partially removed by use of an etching process by use of a mask, to form a second passing hole 22a exposing an upper surface of the wafer 20.

Figure 3C:
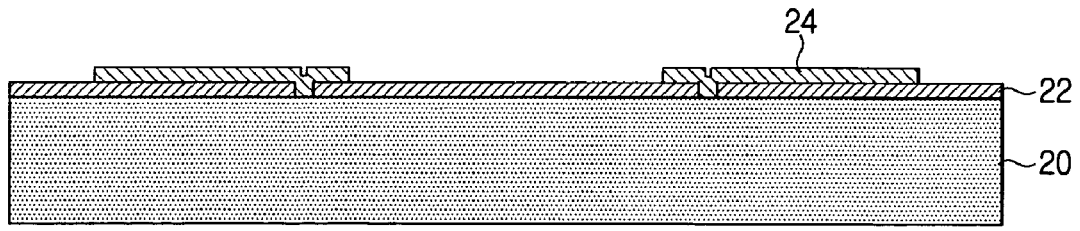
Figure 3D:
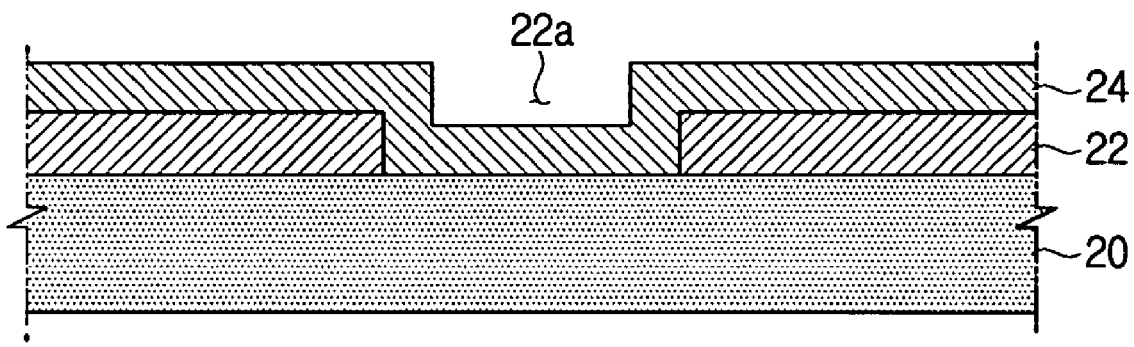

As illustrated in FIG. 3C and FIG. 3D, a cap pad 24 is formed on an upper surface of the insulating layer 22 at a predetermined pattern. A predetermined pattern of photoresist is formed on the upper surface of the insulating layer 22 to form the cap pad 24. Metals are applied to cover the insulating layer 22 and the photoresist by use of a spray coating process. A predetermined pattern of cap pad 24 is formed by removing the photoresist by use of a lift-off process. The cap pad 24 is formed on the upper surface of the insulating layer 22, the second passing hole 22a and the exposed wafer 20, at a predetermined thickness. There is no problem with the metals possibly projecting higher than the depth of the second passing hole 22a, thereby requiring no flatting process and enabling connection of the metal line 26 and the cap pad 24 by a one-time process. Accordingly, the number of processes for fabricating the packaging cap is reduced.

Figure 3E:
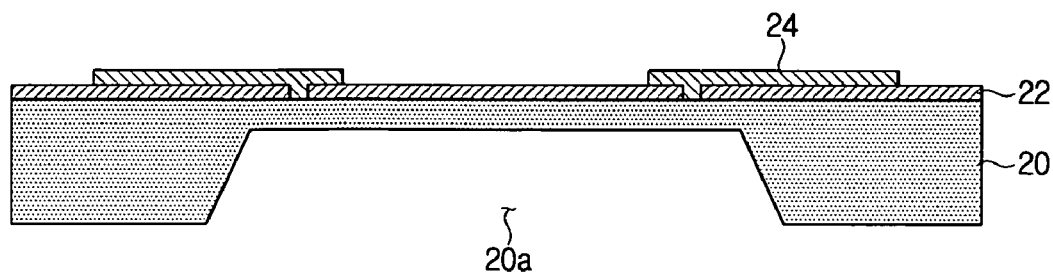

As illustrated in FIG. 3E, a cavity 20a is formed on a lower surface of the wafer 20. The cavity 20a may be formed by use of a wet etching process. The cavity 20a is processed such that the wafer 20 is 10 to 20 μm thick between a bottom of the cavity 20a and the upper surface of the wafer 20. The width of the cavity 20a may be adjusted for the size of a device 50.

Figure 3F:
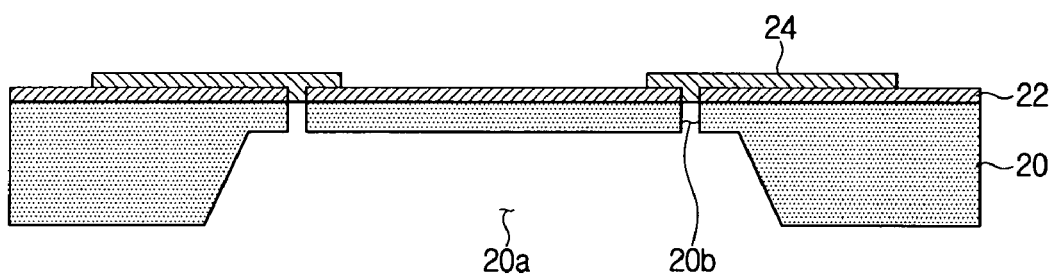

As illustrated in FIG. 3F, the wafer 20 is etched from the bottom surface of the cavity 20a to form a first passing hole 20b. Formation of the first passing hole 20b is processed to expose the cap pad 24 through the cavity 20a. Formation of the first passing hole 20b may use a dry etching process. The dry etching process may employ an induced coupled plasma ion etching device (ICP-RIE).

Figure 3G:
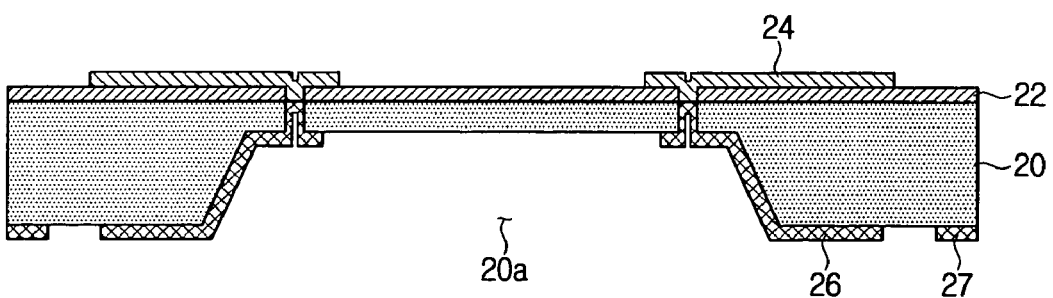

As illustrated in FIG. 3G, a metal line 26 and a sealing line 27 are formed on the lower surface of the wafer 20.

The metal line 26 is formed in a predetermined pattern, extending from the lower surface of the wafer 20 through an inclined surface to a flat bottom surface of the cavity 20a. As illustrated in FIG. 2B, the metal line 26 directly connects to the cap pad 24 exposed through the first passing hole 20b. The metal line 26 is patterned by use of the spray coating and lift-off process. A metal line fabrication method will be described in more detail hereinafter. The sealing line 27 is patterned together with the metal line 26 when it is formed. The metal line 26 is located according to a sealing line 42 formed on a upper surface of a wafer body 40 of a device wafer 4. The sealing line 27 and the metal line 26 are formed of metals such as copper (Cu), gold (Au) and nickel (Ni).

The metal line 26 is formed in a predetermined pattern on the lower surface of the wafer 20 and connects to the cap pad 24.

Figure 4A:
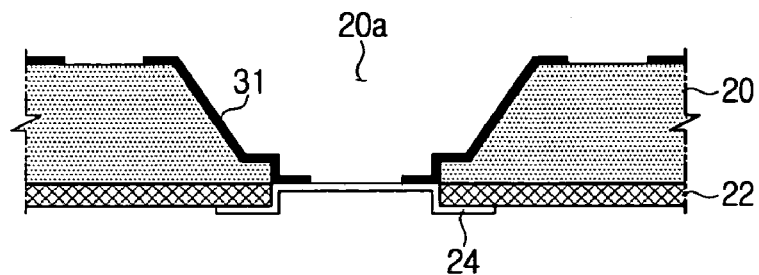
FIGS. 4A through 4C show a process of forming a metal line in FIG. 3G.

In the first step of the metal line 26 fabrication, an insulating layer 31 is patterned on the lower surface of the wafer 20 at a predetermined thickness, as illustrated in FIG. 4A. The insulating layer 31 may formed of polymer materials including B-staged bisbenzocyclobutene (BCB). The insulating layer 31 is formed by patterning the insulating materials by use of spray coating. The cap pad 24 is exposed to the cavity 20a through the insulating layer 31 and a part of the lower surface of the wafer 20 is exposed.

Figure 4B:
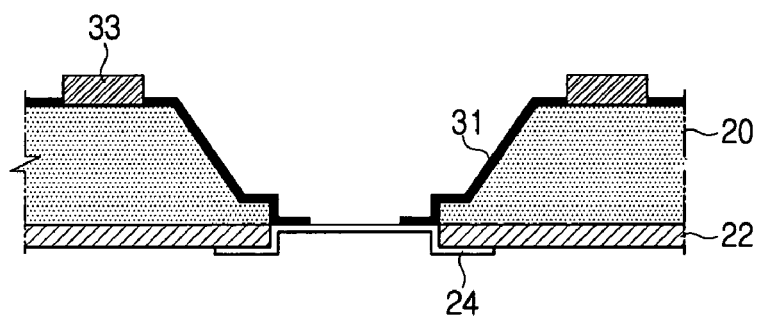

As illustrated in FIG. 4B, a resist 33 is patterned by a spray-coating process to cover the exposed lower surface of the wafer 20. The resist 33 may include a lift-off resist (LOR) and a photoresist (PR) thinner than the LOR.

Figure 4C:
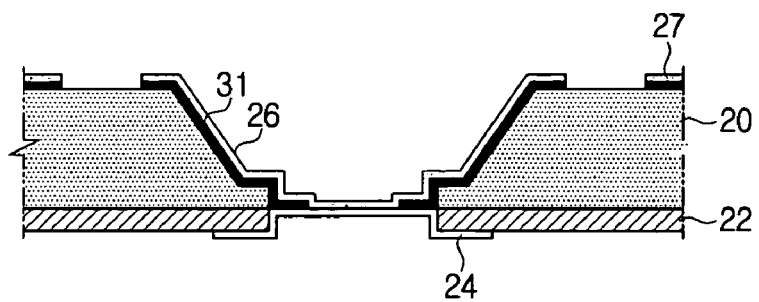

As illustrated in FIG. 4C, the metal line 26 is formed by applying the metals to cover the lower surfaces of the resist 33 and the wafer 20, and the cap pad 24 exposed through the cavity 20a, and patterning the applied metals. A predetermined pattern of metal line 26 is formed by applying the metals on the wafer 20 by use of a spray coating process and removing the resist 33 by use of the lift-off process. The sealing line 27 is simultaneously formed by the metals applied for forming the metal line 26.

Likewise, it is possible to electrically connect the cap pad 24 and the metal line 26 by patterning the metals by use of the lift-off process, without requiring a plating process. Accordingly, it is possible to shorten the manufacturing process and time, so that productivity is enhanced and manufacturing costs are saved.

Also, the metal line 26 may be formed by use of the following second exemplary method.

Figure 5A:
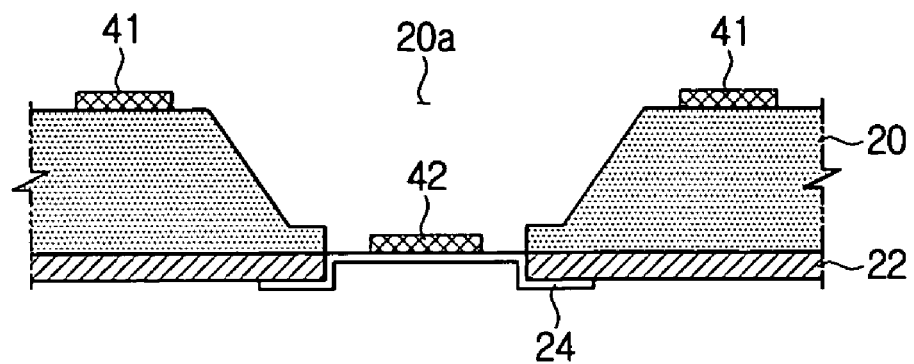
FIGS. 5A through 5E are another example of forming the metal line in FIG. 3G.

As illustrated in FIG. 5A, resists 41 and 42 are formed in a predetermined pattern on a predetermined part of a lower surface of the wafer 20, by use of a spray coating process. One resist 41 is formed around a cavity 20a on the lower surface of the wafer 20, and the other resist 42 is formed to cover a predetermined part of a cap pad 24 exposed through the cavity 20a.

Figure 5B:
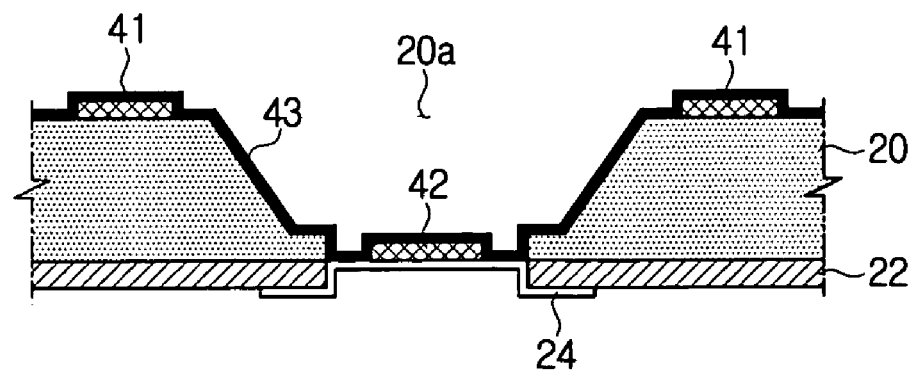

As illustrated in FIG. 5B, in the above state, an insulating layer 43 is formed to cover the entire lower surface of the wafer 20, concretely, the lower surface of the wafer 20 including the resists 41 and 42. The insulating layer 43 is formed by depositing insulating materials at a low temperature, and the insulating materials may be $SiO_2$, SiN, and $TiO_2$.

Figure 5C:
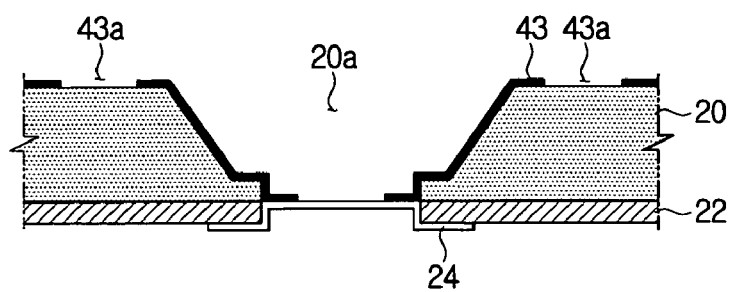

As illustrated in FIG. 5C, the resists 41 and 42 are removed by the use the lift-off process and a part of the lower surface of the wafer 20 and the cap pad 24 are exposed through the cavity 20a.

Figure 5D:
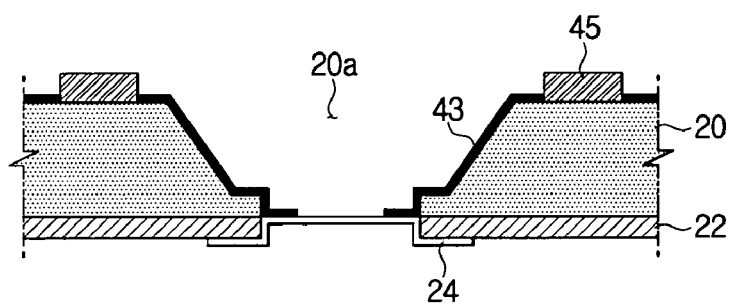

As illustrated in FIG. 5D, the resist 45 is patterned on an exposed part 43a of the cavity 20a of the wafer 20 by use of the spray coating process. The resist 45 may include a lift-off resist (LOR) and a photoresist (PR) relatively thinner than the LOR.

Figure 5E:
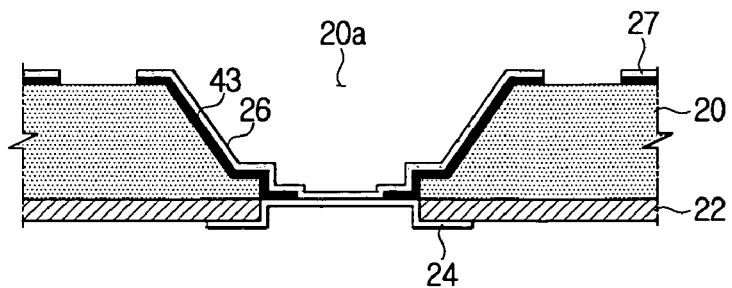

If the metals are applied to cover the entire lower surface of the wafer 20 including the resist 45 and the resist 45 is removed by use of the lift-off process, a metal line 26 and a sealing line 27 are simultaneously formed on the lower surface of the wafer 20, as illustrated in FIG. 5E. The metal line 26 is formed by spray-coating the metals, and applying and patterning the spray-coated metals. The metal line 26 is directly connected to the cap pad 24 which is exposed through the cavity 20a without using a separate plating process.

As in the above embodiment, it is possible to shorten the manufacturing process and time in order to fabricate the packaging cap at a low price.

The packaging is completed by joining the above-finished packaging cap 3 and a packaged surface of the device wafer 4, as illustrated in FIG. 2A.

With the abovementioned, the wafer level packaging cap and the fabrication method thereof according the embodiment of the present invention, the upper and lower surfaces of the cavity are spray-coated with the metals, and patterned by use of the lift-off process, so as to pattern deep inside the cavity. Accordingly, a via hole which is not as deep (the first passing hole) is formed, saving the high costs to be incurred for deep processing the via hole.

The via hole (the first passing hole) is not deep and the cap pad and the metal line may be directly connected, thus eliminating the plating process for filling the via hole with the metals. Advantageously, the reliability of the process is enhanced and plating costs are saved.

The cavity may be designed to be deep, so that freedom of design of the depth of the cavity is improved at the time of packaging the device.

The cap pad and the metal line are processed by use of the lift-off process at the time of patterning, not requiring an etching process. The entire process may be simplified by easily connecting processes after and before the patterning process.

While the invention has been shown and described with reference to exemplary embodiments thereof, it will be understood by those skilled in the art that various changes in form and details may be made therein without departing from the spirit and scope of the invention as defined by the appended claims.

What is claimed is:

1. A wafer level packaging cap for covering a device wafer provided with a device thereon, the wafer level packaging cap, comprising:
    a cap substrate formed with a predetermined cavity for housing the device on a lower surface, the cap having a first passing hole penetrating between an upper surface of the cap and the predetermined cavity, and the cap being adapted to be joined with the device wafer;
    an insulating layer formed on the upper surface of the cap substrate and having a second passing hole corresponding to the first passing hole;
    a cap pad formed on an upper surface of the insulating layer; and
    metal lines formed on a lower surface of the cap substrate adapted to correspond to a plurality of device pads which are electrically connected to the device;
    wherein the metal lines and the cap pad are electrically connected to each other at the first and second passing holes.

2. The wafer level packaging cap of claim 1, wherein the cap pad and the metal lines are formed by patterning metals by use of a spray coating process.

3. The wafer level packaging cap of claim 1, wherein the first passing hole is 10 to 20 μm deep.

4. The wafer level packaging cap of claim 1, wherein the cap pad and the metal lines are formed at a boundary between the first and second passing holes.

5. The wafer level packaging cap of claim 1, further wherein the cap substrate comprises cap sealing lines corresponding to sealing lines of the device wafer.

6. A wafer level packaging cap for covering a device wafer provided with a device thereon, the wafer level packaging cap, comprising:
    a cap substrate formed with a predetermined cavity for housing the device on a lower surface, the cap having a first passing hole penetrating therethrough and adapted to be joined with the device wafer;
    an insulating layer formed on an upper surface of the cap substrate and having a second passing hole corresponding to the first passing hole;
    a cap pad formed on an upper surface of the insulating layer; and
    metal lines formed on a lower surface of the cap substrate adapted to correspond to a plurality of device pads which are electrically connected to the device;
    wherein the metal lines and the cap pad are electrically connected to each other at the first and second passing holes; and
    wherein the metal lines extend from the lower surface of the cap substrate, a bottom surface of the cavity, and an inclined surface which connects the lower surface of the cap substrate and the bottom surface of the cavity.

* * * * *